(12) United States Patent
Ciavatti

(10) Patent No.: US 6,432,771 B1
(45) Date of Patent: Aug. 13, 2002

(54) DRAM AND MOS TRANSISTOR MANUFACTURING

(75) Inventor: Jérôme Ciavatti, Saint Martin d'Heres (FR)

(73) Assignee: STMicroelectronics SA, Gentilly (FR)

( * ) Notice: Subject to any disclaimer, the term of this patent is extended or adjusted under 35 U.S.C. 154(b) by 0 days.

(21) Appl. No.: 09/433,829

(22) Filed: Nov. 3, 1999

(30) Foreign Application Priority Data

Nov. 5, 1998 (FR) .............................. 98 14091

(51) Int. Cl.7 .......................................... H01L 21/8242
(52) U.S. Cl. ..................... 438/253; 438/258; 438/266; 438/396
(58) Field of Search ................ 438/253, 258, 438/266, 396, 397, 398, 241, 243; 257/296, 306, 307, 308

(56) References Cited

U.S. PATENT DOCUMENTS

| 5,387,533 A | 2/1995 | Kim ............................ 437/52 |
| 5,486,712 A | 1/1996 | Arima ......................... 257/296 |
| 5,602,051 A | 2/1997 | Cronin et al. ................. 437/52 |
| 5,780,339 A | 7/1998 | Liu et al. ..................... 438/253 |
| 5,789,289 A | 8/1998 | Jeng ............................ 438/253 |
| 6,001,683 A | * 12/1999 | Lee ............................ 438/241 |
| 6,025,221 A | * 2/2000 | Brown et al. ................ 438/238 |

FOREIGN PATENT DOCUMENTS

| JP | 10079491 | 3/1998 |
| WO | WO 99/10930 | 3/1999 |

* cited by examiner

Primary Examiner—Olik Chaudhuri
Assistant Examiner—Theresa T. Doan
(74) Attorney, Agent, or Firm—Lisa K. Jorgenson; Robert Iannucci; Seed IP Law Group PLLC

(57) ABSTRACT

A method of manufacturing DRAM cells in a substrate, including the steps of: depositing a first conductor in first openings in a first insulator partially exposing source/drain regions; opening a second insulator to partially expose the first openings contacting the source/drain regions, depositing a second conductor, then a third insulator, delimiting in the third insulator and second conductor bit lines of the memory cells, and forming lateral spacers on the sides of the bit lines; opening a fourth insulator to partially expose the first openings in contact with the drain/source regions of the transistors; depositing and etching a third conductor; conformally depositing a dielectric; and depositing a third conductor.

23 Claims, 6 Drawing Sheets

DRAM AND MOS TRANSISTOR MANUFACTURING

FIELD OF THE INVENTION

The present invention relates to the manufacturing in monolithic form of DRAM cells. More specifically, the present invention relates to the manufacturing on a same semiconductive wafer of DRAM cells and of MOS transistors according to a method compatible with a standard CMOS process.

SUMMARY OF THE INVENTION

The present invention aims at providing a novel method of simultaneous manufacturing of DRAM cells and of MOS transistors in a same integrated circuit which is relatively simple.

The present invention also aims at providing such a method which enables increasing the density of DRAM cells.

For this purpose, the present invention provides a method of manufacturing DRAM cells in a semiconductor substrate, each including a MOS control transistor and a capacitor, including the steps of:

a) forming first openings in a first insulating layer to partially expose source/drain regions of the control transistors and filling the first openings with a first conductive material;

b) depositing a second insulating layer, forming therein second openings, to partially expose the first openings over contacts with the source/drain regions of the transistors, successively depositing a second conductive material, then a third insulating layer, defining in the third insulating layer and the second conductive material bit line structures of the memory cells, and forming lateral spacers on the sides of the bit lines;

c) depositing a fourth insulating layer;

d) forming in the fourth insulating layer third openings, to partially expose the first openings in contact with the drain/source regions of the transistors;

e) depositing and etching a third conductive material, to cover the walls and the bottom of the third openings, forming a first electrode of the capacitor;

f) conformally depositing a dielectric material forming an insulator of the capacitor; and g) depositing a third conductive material forming a second electrode of the capacitor.

According to an embodiment of the present invention, before step b) of deposition of the second insulating layer and of formation of the bit line structures, insulating pads are formed above the first openings contacting the source/drain regions of the control transistors.

According to an embodiment of the present invention, step c) of deposition of the fourth insulating layer is performed so that its upper surface is substantially planar.

According to an embodiment of the present invention, the first insulating layer is a multilayer. The lower and upper layers of the multilayer forming the first insulating layer are respectively made of first and second insulating materials selectively etchable with respect to each other. The second insulating layer is also a multilayer. The upper and lower layers of the multilayer forming the second insulating layer are respectively made of first and second insulating materials selectively etchable with respect to each other.

According to an embodiment of the present invention, the insulating pads are formed by deposition of a layer made of a first insulating material. The insulating pads are formed by the deposition of a multilayer, the upper layer of which is made of a first insulating material.

According to an embodiment of the present invention, step a) of forming and filling of the first openings is also performed in a second portion of the substrate to partially expose and contact semiconductive regions.

According to an embodiment of the present invention, the insulating pads are simultaneously formed above the first openings contacting the source/drain regions of the control transistors and the first openings contacting the semiconductive regions.

According to an embodiment of the present invention, the third insulating layer as well as the spacers are made of a first insulating material.

According to an embodiment of the present invention, the fourth and fifth insulating layers are made of a second insulating material.

According to an embodiment of the present invention, the first insulating material is silicon nitride and the second insulating material is silicon oxide.

The foregoing objects, features and advantages of the present invention will be discussed in detail in the following non-limiting description of specific embodiments in connection with the accompanying drawings.

DETAILED DESCRIPTION OF THE INVENTION

Figure 1:
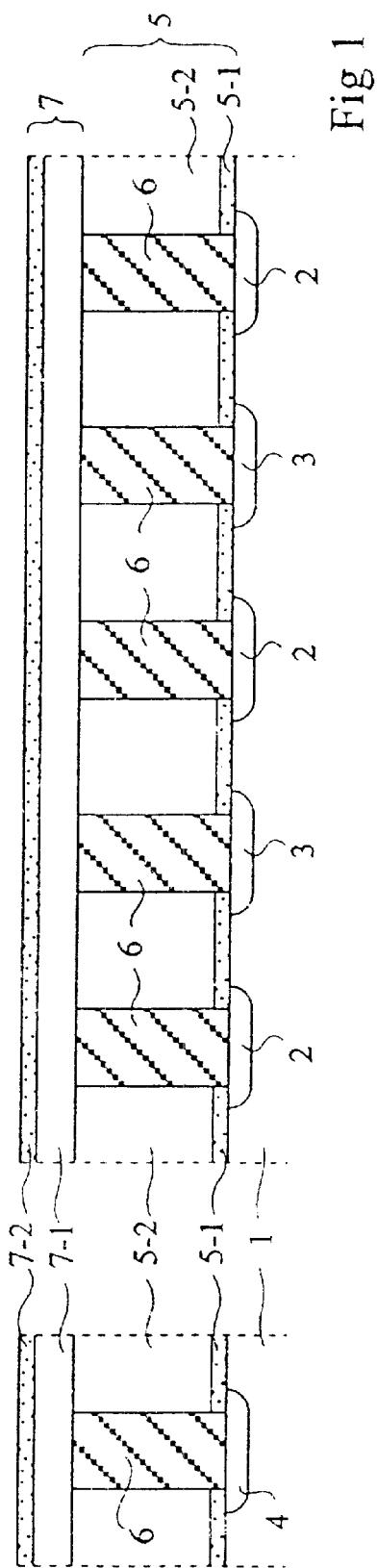
FIGS. 1 to 6 are cross-sectional views of a same integrated circuit wafer at different successive steps of its manufacturing according to an embodiment of the present invention.

For clarity, the same elements have been referred to with the same references in the different drawings. Furthermore, as is typical in the representation of integrated circuits, the different cross-section views are not drawn to scale.

A first embodiment of the present invention will be discussed hereafter in relation with FIGS. 1 to 6.

On the right of the drawings, it is desired to form, on a first portion of a semiconductor substrate 1 typically made of silicon, DRAM cells, each of which is formed by a MOS control transistor and a capacitor. An electrode of the capacitor being in contact with the drain/source region of the transistor. On a second portion of substrate 1, shown on the left of the drawings, forming logic circuits including MOS transistors is desired. Hereafter, the first and second portions will be respectively called the memory side and the logic side. It should be noted that "substrate" includes the actual substrate, as well as doped wells and/or regions formed therein. It will be assumed hereafter that, on the memory side and on the logic side, MOS transistor and control transistor structures of the memory cells have already been formed in the substrate and these structures are not shown in the drawings.

More specifically, on the memory side, it is desired to form bit lines in contact with a source/drain region 2 of the control transistors, and a capacitor having a first electrode in contact with a drain/source region 3 of the control transistors. On the logic side, it is desired to form contacts with semiconductive drain or source regions 4 also formed in substrate 1. These last contact recovery areas, on the logic side, will each have to join a metal interconnection line located at a given height above the substrate. The height is determined by the constraints of a conventional CMOS method, for example, between 0.6 and 2 μm, currently on the order of 1 μm.

An insulating layer 5 is first deposited on the logic side and on the memory side so that its upper surface is substantially planar. According to a specific embodiment, layer 5 will be a multilayer formed of materials selectively etchable with respect to each other. For example, it will be formed of a thin silicon nitride ($Si_3N_4$) as layer 5-1 and a thick silicon oxide ($SiO_2$) layer 5-2.

According to the present invention, by means of a common mask, first openings having similar dimensions are then formed in insulating layer 5 to expose on the memory side source/drain regions 2 and 3, and on the logic side source or drain regions 4.

A first conductive material 6, for example, polysilicon or tungsten, is then deposited and etched, to fill the first openings.

The step sequences which will be described hereafter in relation with FIGS. 2 to 5 are essentially intended for making the desired structure on the memory side.

A second insulating layer 7 is deposited and etched so that its upper surface is substantially planar. According to the specific embodiment shown in FIG. 1, second insulating layer 7 is a multilayer formed of two materials, selectively etchable with respect to each other. For example, it will be formed of a layer 7-1 having the same nature as first insulating layer 5, which is made of silicon oxide, and of a silicon nitride layer 7-2.

According to alternatives not shown, second insulating layer 7 may also be a single silicon oxide layer or a single silicon nitride layer. However, the use of a multilayer 7-1/7-2 will be preferred for reasons which will be discussed hereafter.

Figure 2:
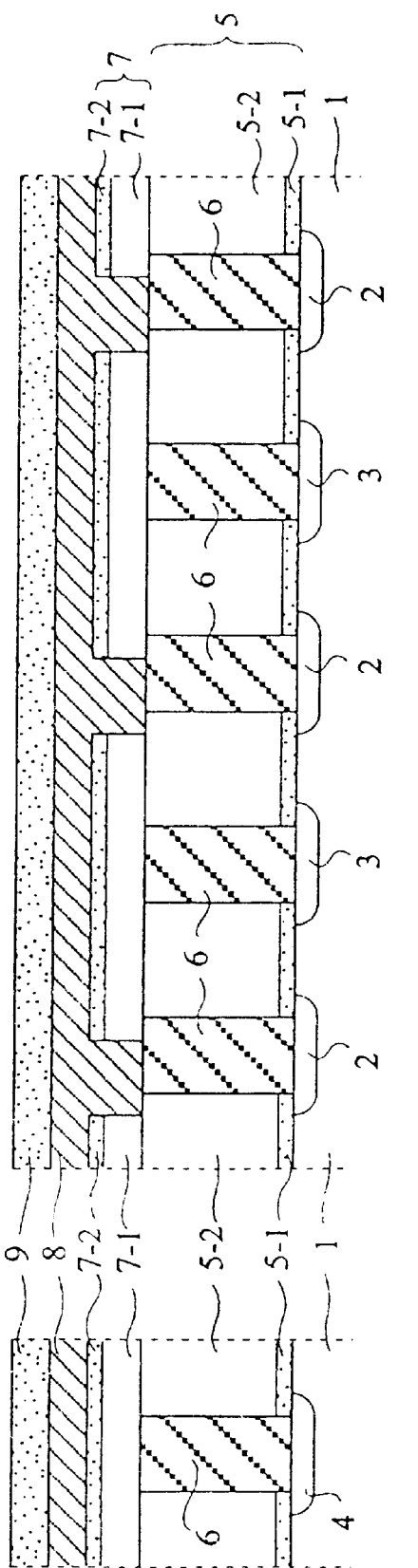

As illustrated in FIG. 2, at the next steps, second openings are formed in second insulating layer 7 to partially expose the upper surface of those of the first openings which contact source/drain regions 2 of the control transistors of the memory cells.

These second openings are then filled by depositing a second conductive material 8, for example, conformally deposited tungsten, or titanium/titanium nitride. A third insulating layer 9, for example, made of silicon nitride, is then conformally deposited.

It should be noted that, according to the embodiments shown in FIGS. 2 to 6, and 7, it is assumed that the thickness of layer 8 is sufficient to completely fill up the second openings. In practice, this may not necessarily be the case, and the upper surface of third insulating layer 9 could exhibit corresponding hollowings with no specific impact on the rest of the process.

Figure 3:
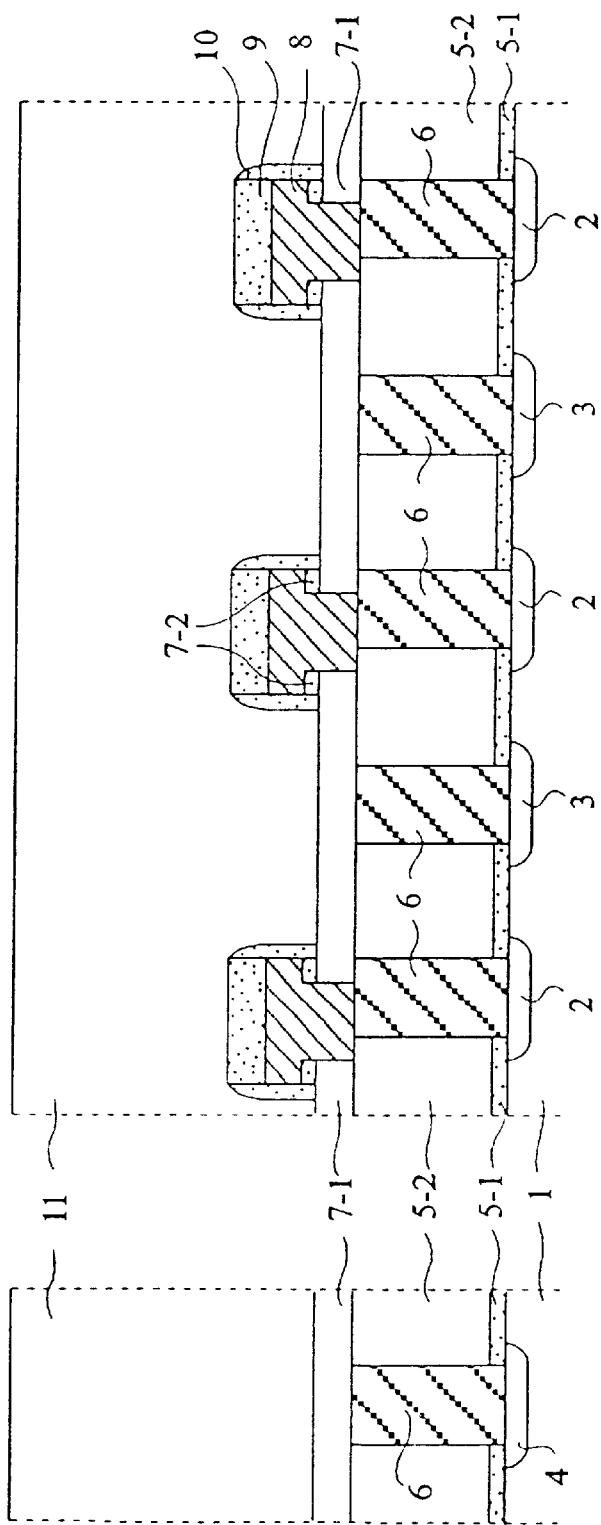

At the next steps, illustrated in FIG. 3, insulating layer 9, conductive layer 8, and insulating layer 7-2 are etched to form bit line structures above the second openings filled with the second material 8. The bit lines are formed of elements of conductive material 8 in electric contact with sources/drains 2, via conductor 6. Spacers 10, for example, made of silicon nitride, are then formed on the sides of elements 8. Thus, conductive lines 8 are protected on all sides by a silicon nitride layer, at the top, layer 9, at the bottom, layer 7-2 and, laterally, spacer 10. A fourth insulating layer 11, having the same nature as insulating layer 7-1, for example, made of silicon oxide, is then deposited. According to a specific embodiment, layer 11 can then be planarized.

On the logic side, after these steps, only layers 7-1 and 11 are kept.

Figure 4:
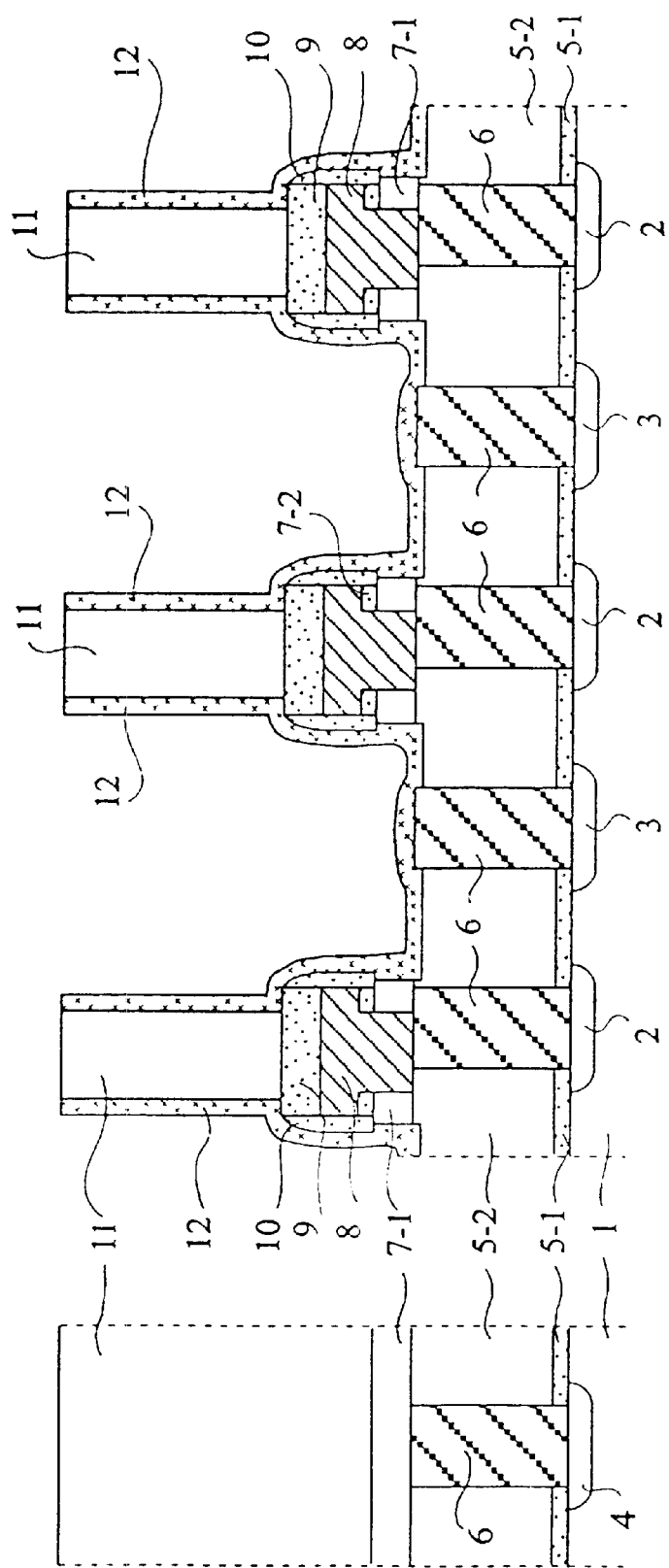

Then, as illustrated in FIG. 4, fourth insulating layer 11 is removed on the memory side to only keep it above a portion of each of bit lines 8. Layer 7-1 will also be removed. Third openings exposing the upper surfaces and possibly the sides of first conductors 6 in contact with drain/source regions 3 are thus formed. Then, a third conductive material 12, for example, polysilicon, is deposited to cover the walls and the bottom of the third openings. Third conductive material 12 is then etched by any known means to remove the portions of third conductive material 12 formed above insulating layer 11.

It should be noted that since fourth insulating layer 11 and layers 7-1 and 5-2 are made of a same insulating material (silicon oxide), their etching may advantageously be performed according to a same method. There will then be a limited lateral overetch of layer 7-1 under the bit line structures. The overetch of first insulating layer 5-2 may be voluntarily enhanced to increase the capacitance of the capacitor being formed.

Third insulating layer 9, spacers 10, and the residue of layer 7-2 being made of a same material (silicon nitride) selectively etchable with respect to the first material, they form etch stop layers which protect the bit lines. Conductor 12 subsequently deposited thus does not risk coming in contact with the bit line, be it by the top, by the bottom, or by the sides. According to an embodiment which will be described hereafter in relation with FIG. 7, an additional protection against short-circuits may be provided between conductor 12 and conductor 6 of contact between bit lines 8 and source/drain regions 2.

On the logic side, after these steps, only layer 11 remains in place.

According to the present invention, the residue of fourth insulating layer 11 may be or may not be partially etched or completely removed on the memory side.

Figure 5:
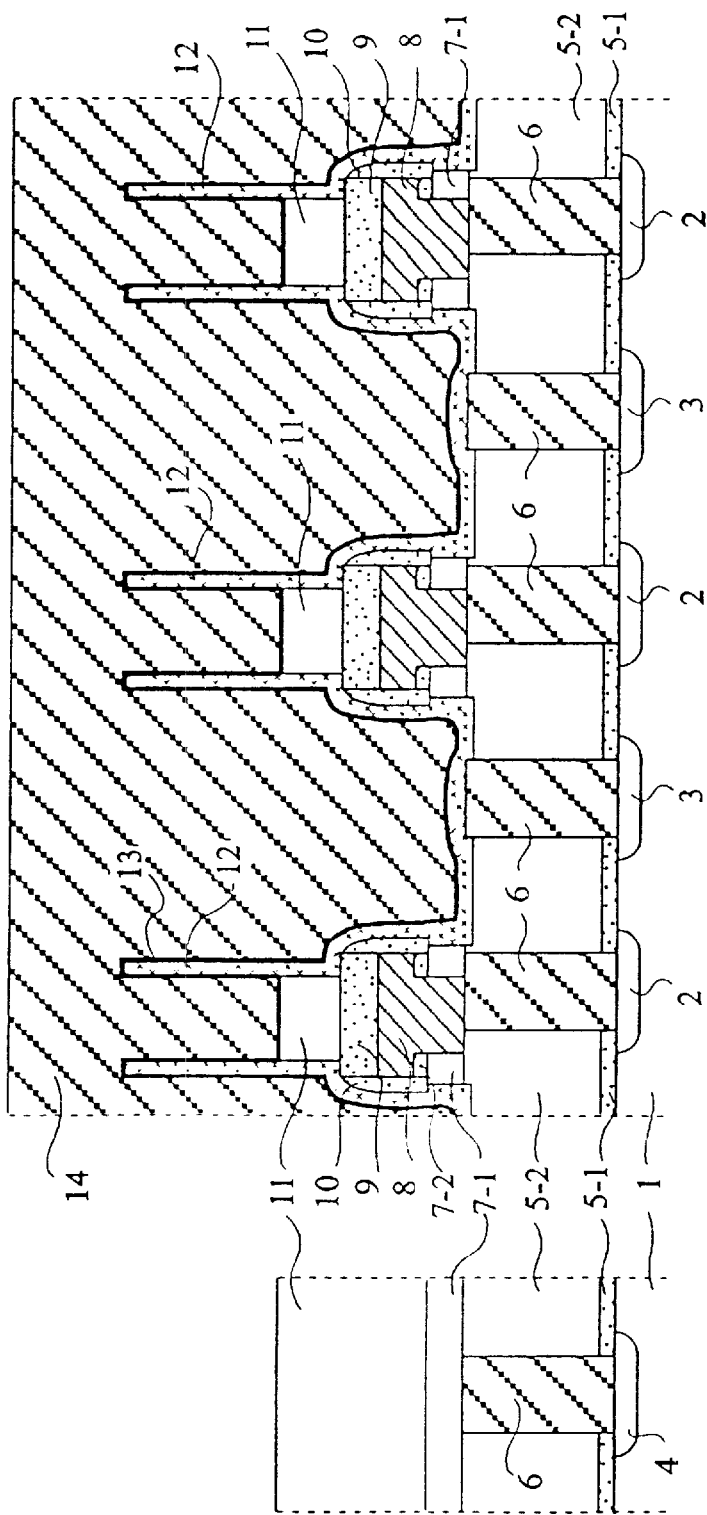

FIG. 5 illustrates a specific embodiment of the present invention according to which a portion of layer 11 has been partially removed. This removal is performed on the memory side and on the logic side.

At the next steps, also illustrated in FIG. 5, a thin layer of a dielectric material 13, for example, tantalum oxide ($Ta_2O_5$) or a silicon oxide—silicon nitride—silicon oxide (ONO) multilayer is deposited. A fourth conductive material 14, for example, polysilicon, is then deposited. Conductor 14 is deposited and etched to completely fill the third openings and so that its upper surface is substantially planar. According to an alternative not shown, the fourth conductive material may be titanium nitride. Then, the third openings are not completely filled up.

Capacitors, each including a first U-shaped electrode formed of third conductive material 12, a dielectric formed of insulating material 13, and a second common electrode formed of a fourth conductive material 14, have thus been formed on the memory side. Each of first electrodes 12 is in electric contact with a drain/source region 3 via conductor 6. On the logic side, after these steps, only layer 11, which is partially etched, remains in place.

Figure 6:
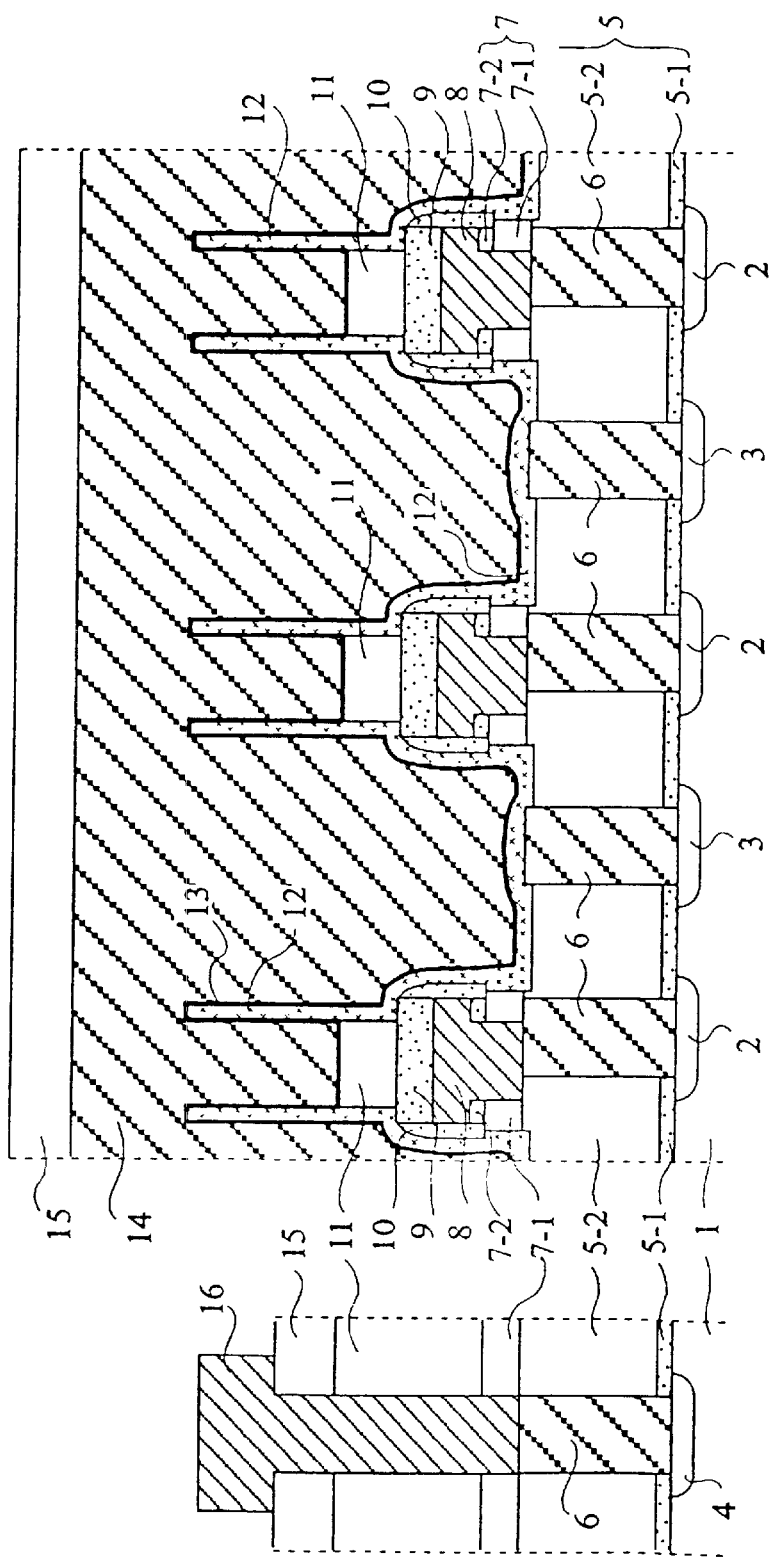

At the next steps, illustrated in FIG. 6, a fifth insulating layer 15, for example, made of silicon oxide, is conformally deposited on the logic side and on the memory side. Fourth openings are then formed in layer 15 to expose on the logic side the filled surfaces of the first openings in contact with source or drain regions 4. These fourth openings are filled with a fifth conductive material 16, for example, tungsten.

According to a specific embodiment of the present invention, the nature and the thicknesses of the different layers are the following:

first insulating layer 5:
    5-1: silicon nitride, from 20 to 300 nm, for example, 80 nm;
    5-2: silicon oxide, from 90 to 800 nm, for example, 400 nm;
    width of the first openings, filled by first conductor 6: from 100 to 400 nm, for example, 240 nm;
    first conductive material 6: tungsten;
    second insulating layer 7: multilayer;
    7-1: silicon oxide, from 10 to 200 nm, for example, 50 nm;
    7-2: silicon nitride, from 10 to 100 nm, for example, 20 nm;
    second conductive material 8: tungsten;
    third insulating layer 9: silicon nitride, from 10 to 300 nm, for example, 80 nm;
    fourth insulating layer 11: silicon oxide;
    before etching (and after a possible planarization), FIG. 3, between 300 and 900 nm, for example, 600 nm;
    after etching, on the memory side, FIG. 5, between 10 and 890 nm, for example, 400 nm;
    width of the third openings: 50 nm;
    distance between two third openings: 20 nm;
    third conductive material 12 (first U-shaped electrodes of the capacitors): polysilicon, between 30 and 300 nm, for example, 80 mn;
    dielectric material 13: ONO multilayer or tantalum oxide between 2 and 20 nm, for example, 5 nm;
    fourth conductive material 14: polysilicon, between 100 and 800 nm, for example, 250 nm;
    fifth insulating layer 15: silicon oxide, between 50 and 500 nm, for example, 200 nm; and
    fifth conductive material 16: tungsten, from 200 to 800 nm, for example, 500 nm.

According to an alternative, not shown, the insulator thickness corresponding to layer 5-2 may be formed of a multiple-layer structure of materials selectively etchable with respect to each other. It will be, for example, a silicon oxide—thin silicon nitride surface layer multilayer (ON), or a silicon oxide—thin silicon nitride layer—silicon oxide multilayer (ONO). The thin silicon nitride layer will form in both cases an etch stop layer for the subsequent forming, on the memory side, of the second openings, of forming of the bit lines, of the third openings, and of forming of the capacitor structures, and on the logic side, and of the fourth openings, and of contact forming. In the case of an ONO multilayer, the upper silicon oxide surface enables increasing the capacitance of the formed capacitors.

The method according to the present invention which provides the simultaneous forming of the areas of contact recovery with source/drain regions 2, 3 of the control transistors of the DRAM cells and with semiconductive regions 4 is particularly simple and advantageous. For example, one advantage is that the manufacturing process is freed from necessary guard constraints in conventional methods when it was desired to expose, on the memory side, drain/source regions 3 after forming the bit lines. This enables obtaining DRAMS including a greater density of memory cells.

Another advantage is that forming the areas of contact recovery with regions 4 after forming the upper structures of the memory cells (capacitors and bit lines) is simplified.

Another advantage is that the method of forming contacts 6 between a bit line and a source/drain region 2 becomes conformable to a standard CMOS method including a nitride layer 5-1 at the substrate surface. This simplifies the method by harmonizing it on the logic and memory sides. In practice, in methods of simultaneous formation of MOS transistors and of a DRAM, the silicon nitride layer is formed on the logic side only. Consequently, in conventional methods, drain/source regions 3 are exposed on the memory side after forming bit line structures in contact with source/drain regions 2. Subsequent etching of the nitride layer at the substrate surface would cause the etching of the spacers of the bit line structures. The short-circuits which then appeared between the drain and source regions of the control transistors of the DRAM cells via the bit lines and first electrodes of the capacitors would cause the corresponding cells to malfunction. However, including layer 5-1 on the memory side as an etch stop for layer 5-2, reduces the risk of etching an insulating trench (not shown) having the same nature (silicon oxide) as layer 5-2 and separating two drain or source regions of two distinct control transistors. The corresponding risks of malfunction by short-circuit are thus also reduced.

Another advantage is that all contacts with the substrate, on the memory side and on the logic side, are all of same nature, (conductors 6) unlike conventional methods.

According to another embodiment of the present invention, "insulating pads" may be advantageously provided above conductors 6 which are in contact, on the memory side, with source/drain regions 2, and on the logic side, with source or drain regions 4.

Figure 7:
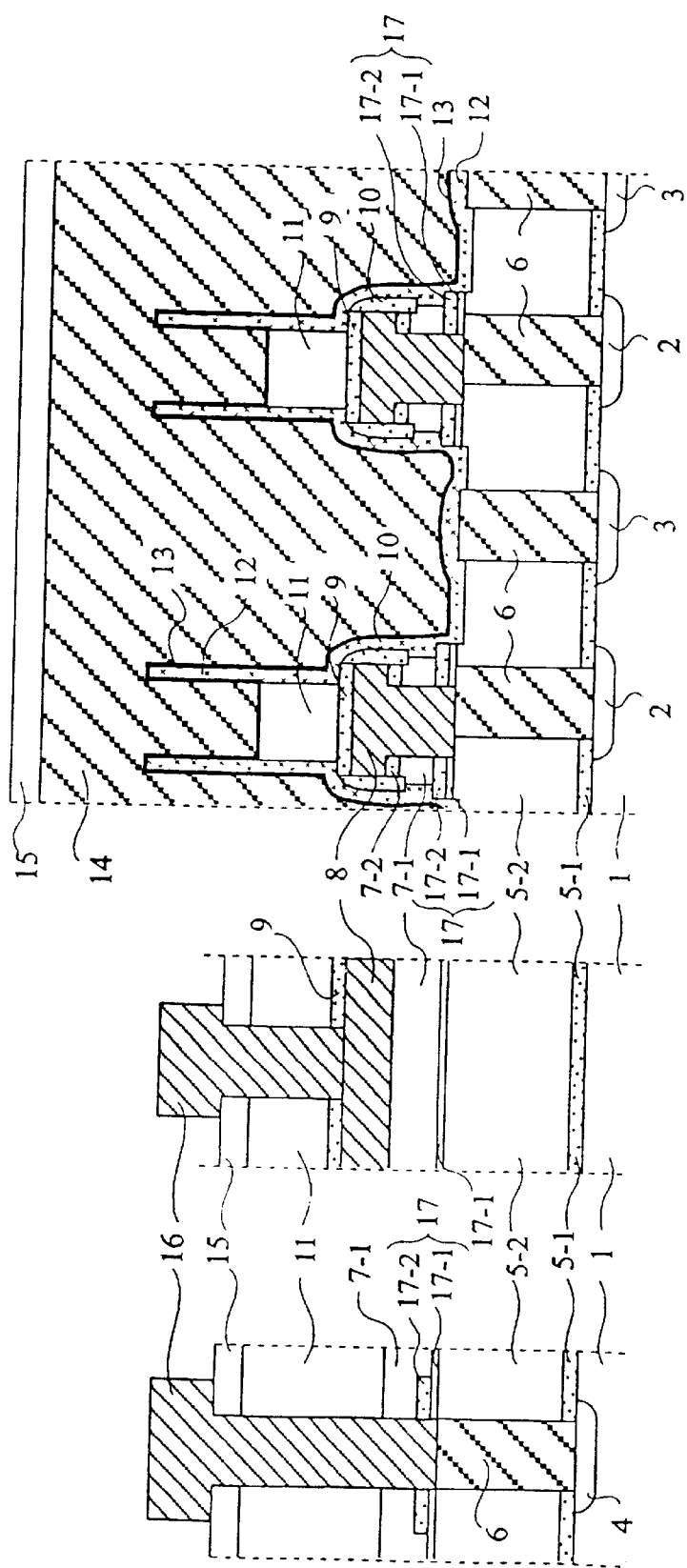
FIG. 7 is a cross-sectional view of an integrated circuit wafer at a step of its manufacturing according to another embodiment of the present invention.

FIG. 7 illustrates, in cross-section, three portions of an integrated circuit wafer according to another embodiment at a step corresponding to the step illustrated in FIG. 6. On the right side of the drawing, DRAM cells are formed in a first portion of substrate 1, which also corresponds to the right-hand portion of FIG. 6. On the left side of the drawing, logic devices are formed in a second portion of substrate 1 which also corresponds to the left-hand portion of FIG. 6. Finally, at the center of the drawing, in a third portion of the substrate outside the memory plane which is not shown in the preceding drawings, a contact BL with a bit line 8 of one of the DRAM cells of the right-hand portion has been shown.

As in the embodiment shown in FIG. 1, the following steps have been performed: forming an insulating layer 5, including, for example, a silicon nitride layer 5-1 and a silicon oxide layer 5-2, forming first openings to partially expose regions 2, 3, and 4 of substrate 1, and filling first openings with a conductive material 6.

Then, according to the present embodiment, a new insulating layer 17 is deposited. Layer 17 may be a single layer of a material selectively etchable with respect to insulating layer 5-2, for example, silicon nitride, deposited having a thickness between 10 and 200 nm, for example, 80 nm. In the case of the specific embodiment shown in FIG. 7, insulating layer 17 is a multilayer formed of a first layer 17-1 having the same nature as insulating layer 5-2 and upper layer 17-2. That is, a second material selectively etchable with respect to the first material forming layer 17-1. For example, layer 17-1 may be made of silicon oxide deposited having a thickness from 10 to 100 nm, for example, 50 nm, and layer 17-2 may be made of silicon nitride having a thickness between 20 and 200 nm, for example, 80 nm.

Following formation, the layer made of the second insulating material (single layer 17 or layer 17-2) is etched. The underlying layer made of the first material (layer 5-2 or layer 17-1) is used as an etch stop. This etching is performed to form portions of the layer (17/17-2) made of the second insulating material above the contacts with regions 2 and 4. Thus, "insulating pads" are formed above these contacts.

The subsequent steps of the method are similar to those previously described in relation with FIGS. 3 to 6, except that the insulating pads have to be etched upon formation of the second and fourth openings, that is formation of the bit line—source/drain regions 2 contacts and formation of the contacts with regions 4. Layer 17-1 will also have to be etched upon formation of the third openings, so that first electrodes 12 of the capacitors contact drain/source regions 3 via conductors 6.

An advantage of this embodiment, which provides for the formation of insulating pads at least partially made of silicon nitride, is that upon formation of the third openings in silicon oxide insulating layer 11, the protection of the contact between bit line 8 and source/drain region 2 via conductor 6 is increased. The etching of these third openings will be stopped further away from conductor 6 than previously. Consequently, risks of causing a short-circuit between sources/drains 2 and drains/sources 3 of the control transistors of the memory cells via first electrodes 12 overetching are considerably reduced.

Another advantage is to be able to get rid of lateral guards and to further increase the memory cell density. Furthermore, the pad formation enables drawing the bit lines closer to one another.

Another advantage of this embodiment is linked to the formation of insulating pads in the region where contacts 16/6 with drain or source regions 4 are to be formed. Indeed, simultaneously with the forming and filling the fourth openings, intended for exposing conductors 6 above semiconductive regions 4. This is shown in the figures at the center of FIG. 7. In the region where contact BL is to be formed, bit line 8 is protected by layer 9 made of the second insulating material. By using an insulating pad formed of a layer 17-2 of the same second insulating material having the same thickness as layer 9, the method of forming the fifth openings is homogenized and thus, simplifies the manufacturing process.

It should be noted that the thicknesses of the fourth insulating layer 11 after etching, and of the fifth insulating layer 15, are chosen to ensure that the metallization in contact with a semiconductive region 4 is positioned at a height corresponding to standard CMOS process constraints.

Of course, the present invention is likely to have various alterations, modifications, and improvements which will readily occur to those skilled in the art. In particular, it applies to any method of simultaneous manufacturing MOS transistors and DRAM cells incorporating steps of a standard CMOS process. Thus, the nature and the thickness of each of the layers may be modified according to the constraints of the standard CMOS process which incorporate the steps specific to the memory cell formation, or according to the capacitance of the memory elements. Additionally, the insulators used may be chosen from among the various known materials or combinations thereof, for example, in the form of multilayers. Further, although the materials of the filling layers of the different openings are preferably chosen to be identical and identical to the metal (tungsten) deposited above and laterally with respect to these openings (bit lines, metallization 17), different filling materials may be used for each of the different openings and/or materials different from the materials of the conductive layers deposited above these openings. Furthermore, the deposition of any metal conductive layer may be preceded by the deposition of a bonding and/or etch stop layer.

Such alterations, modifications, and improvements are intended to be part of this disclosure, and are intended to be within the spirit and the scope of the present invention.

Accordingly, the foregoing description is by way of example only and is not intended to be limiting. The present invention is limited only as defined in the following claims and the equivalents thereto.

What is claimed is:

1. A method of manufacturing DRAM cells at a memory side of a semiconductor substrate and logic circuits at a logic side of the substrate, each DRAM cell including a MOS control transistor and a capacitor, and the logic circuit including logic transistors, the method including the steps of:

a) forming first openings in a first insulating layer to partially expose source/drain regions of the control transistors and the logic transistors, and filling the first openings with a first conductive material, thereby forming a plurality of contacts of the first conductive material that contact the source/drain regions of the control transistors and the logic transistors, the plurality of contacts including a first subset of contacts that contact a first subset of the source/drain regions of the control transistors, a second subset of contacts that contact a second subset of the source/drain regions of the control transistors, and a third subset of contacts that contact the source/drain regions of the logic transistors;

b) depositing a second insulating layer on the contacts that contact the source/drain regions of the control transistors and the logic transistors, forming in the second insulating layer, on the memory side, second openings, to expose the first subset of contacts, successively depositing a second conductive material, then a third insulating layer, defining in the third insulating layer and the second conductive material bit line structures coupled to the first subset of the contacts, and forming lateral spacers on sides of the bit line structures;

c) depositing a fourth insulating layer on the second insulating layer above the second and third subsets of contacts;

d) forming in the fourth insulating layer third openings, to expose the second subset of contacts;

e) depositing and etching a third conductive material, to cover walls and a bottom of the third openings, forming a first electrode of the capacitor;

f) conformally depositing a dielectric material forming in insulator of the capacitor;

g) depositing a fourth conductive material forming a second electrode of the capacitor;

h) depositing another dielectric material on the fourth insulating layer above the logic transistor; and i) forming, on the logic side, fourth openings filled with a conductive material in contact with the third subset of contacts.

2. The method of claim 1, further comprising before step b) of depositing the second insulating layer and forming the bit line structures, forming insulating pads above the contacts of the first subset.

3. The method of claim 2 wherein the insulating pads are formed by depositing a layer made of a first insulating material.

4. The method of claim 2 wherein the insulating pads are formed by depositing a multilayer having an upper layer made of a first insulating material.

5. The method of claim 4 wherein the insulating pads are simultaneously formed above the first subsets of contacts and the third subset of contacts.

6. The method of claim 1 wherein step c) of depositing the fourth insulating layer is performed so that an upper surface of the fourth insulating layer is substantially planar.

7. The method of claim 1 wherein the first insulating layer comprises a multilayer.

8. The method of claim 7 wherein lower and upper layers of the multilayer forming the first insulating layer are respectively made of first and second insulating materials selectively etchable with respect to each other.

9. The method of claim 8 wherein the first insulating material is silicon nitride and the second insulating material is silicon oxide.

10. The method of claim 1 wherein the second insulating layer comprises a multilayer.

11. The method of claim 10 wherein upper and lower layers of the multilayer forming the second insulating layer are respectively made of first and second insulating materials selectively etchable with respect to each other.

12. The method of claim 1 wherein the third insulating layer as well as the spacers are made of a first insulating material.

13. The method of claim 12, further comprising depositing a fifth isolating layer and wherein the fourth and fifth insulating layers are made of a second insulating material.

14. A method for manufacturing memory cells on a semiconductor substrate having a surface divided into a memory side and a logic side, the method comprising:

forming a first insulating layer over the substrate and forming first openings in the first insulating layer to expose first and second source/drain regions of the memory cells formed on the memory side and third source/drain regions of MOS transistors formed in the logic side;

filling the first openings with a first conductive material to electrically contact the first, second, and third source/drain regions;

forming a second insulating layer over the first insulating layer and forming second openings in the second insulating layer to expose the first conductive material filling the first openings and contacting the first source/drain regions;

depositing a second conductive material over the second insulating layer to fill the second openings and electrically contact the first source/drain regions;

forming a third insulating layer over the second conductive material;

forming from the third insulating layer and the second conductive material bit line structures to electrically couple the first source/drain regions;

forming sidewall spacers on the bit line structures from an insulating material to electrically insulate the bit line structures;

forming a fourth insulating layer and forming third openings having interior surfaces in the fourth insulating layer to expose the first conductive material filling the first openings and contacting the second source/drain regions and expose portions of the first insulating layer;

forming a first capacitor electrode in contact with the exposed portions of the first insulating layer and the exposed first conductive material filling the first openings and contacting the second source/drain regions by depositing and etching a third conductive material to cover the interior surfaces of the third openings and to electrically couple to the exposed first conductive material;

depositing a dielectric material to form a capacitor dielectric; and depositing a fourth conductive material over the dielectric material to form a second capacitor electrode.

15. The method of claim 14 wherein forming the first insulating layer comprises depositing a first insulating material and depositing a second insulating material over the first insulating material, the second insulating material selectively etchable with respect to the first insulating material.

16. The method of claim 14 wherein forming the second insulating layer comprises depositing a first insulating material and depositing a second insulating material over the first insulating material, the second insulating material selectively etchable with respect to the first insulating material.

17. The method of claim 14 wherein the third insulting layer and the insulating material of the sidewall spacers comprise a first insulating material, and the fourth and fifth insulating layers comprise a second insulating material.

18. The method of claim 17 wherein the first insulating material comprises silicon nitride and the second insulating material comprises silicon oxide.

19. The method of claim 14, further comprising forming insulating pads on the first conductive material filling the first openings and contacting the first source/drain regions, the insulating pads being formed after the first insulating layer and before the second insulating layer.

20. The method of claim 19, further comprising simultaneously forming insulating pads on the first conductive material filling the first openings and contacting the third source/drain regions, the insulating pads being formed after the first insulating layer and before the second insulating layer.

21. The method of claim 20 wherein forming the insulating pads above the first openings contacting the first and third source/drain regions comprises depositing a first layer of a first insulating pad material and depositing a second layer of a second insulating pad material.

22. The method of claim 21 wherein the first insulating pad material comprises silicon oxide and the second insulating pad material comprises silicon nitride.

23. The method of claim 14, further comprising:

forming a fifth insulating layer and forming fourth openings in the fifth insulating layer to expose the first conductive material filling the filling the first openings and contacting the third source/drain regions; and depositing a fifth conductive material over the fifth insulating layer to fill the fourth openings and electrically contact the third source/drain regions.

* * * * *